(12) United States Patent
Yun (10) Patent No.: US 7,736,938 B2
(45) Date of Patent: Jun. 15, 2010

(54) METHODS FOR FABRICATING CMOS IMAGE SENSOR

(75) Inventor: Young-Je Yun, Ansan-si (KR)

(73) Assignee: Dongbu HiTek Co., Ltd, Seoul (KR)

( * ) Notice: Subject to any disclaimer, the term of this patent is extended or adjusted under 35 U.S.C. 154(b) by 0 days.

(21) Appl. No.: 12/127,031

(22) Filed: May 27, 2008

(65) Prior Publication Data
US 2009/0170233 A1    Jul. 2, 2009

(30) Foreign Application Priority Data
Dec. 28, 2007    (KR) ...................... 10-2007-0140311

(51) Int. Cl.
*H01L 21/00* (2006.01)
(52) U.S. Cl. .............................. 438/70; 438/29; 438/32; 438/69; 257/E21.527
(58) Field of Classification Search .................. 438/71, 438/116; 257/E21.527
See application file for complete search history.

(56) References Cited

U.S. PATENT DOCUMENTS

2005/0271819 A1 * 12/2005 Wago et al. ................. 427/259

2006/0138578 A1   6/2006 Lim
2006/0151818 A1 *  7/2006 Toumiya ..................... 257/294

FOREIGN PATENT DOCUMENTS

| KR | 2006-0073163 | 9/2003 |
| KR | 10-2006-0073163 | 6/2006 |
| KR | 10-2006-0076396 | 7/2006 |

* cited by examiner

*Primary Examiner*—Charles D Garber
*Assistant Examiner*—Cheung Lee
(74) *Attorney, Agent, or Firm*—Sherr & Vaughn, PLLC (57) ABSTRACT

A method for fabricating a CMOS image sensor for preventing corrosion of a metal pad. The method for fabricating the CMOS image sensor can include sequentially forming a dielectric film, a metal pad having an opening, and a first passivation film on a semiconductor substrate having a scribe lane and a pixel region defined therein, forming a color filter layer on the first passivation film at the pixel region, forming an overcoat layer on the entire surface of the semiconductor substrate, including the metal pad, to reduce the step difference between the scribe lane and the pixel region, forming a micro lens on the overcoat layer at the pixel region, forming a photo resist to expose the overcoat layer at the scribe lane, performing an etching process on the entire surface of the semiconductor substrate to etch the overcoat layer at the scribe lane, and removing the photo resist by a cleaning process.

12 Claims, 9 Drawing Sheets

METHODS FOR FABRICATING CMOS IMAGE SENSOR

This application claims priority under 35 U.S.C. 119 to Korean Patent Application No. 10-2007-0140311 (filed on Dec. 28, 2008), which is hereby incorporated by reference in its entirety.

BACKGROUND

An image sensor is a semiconductor device for converting an optical image into an electric signal. The image sensor may be generally classified as a charge coupled device (CCD) and a CMOS image sensor.

The CCD may include a plurality of photodiodes (PDs) which are arranged in a matrix, each photodiode converting an optical signal into an electric signal. In the matrix of the photodiodes, a plurality of vertical charge coupled devices (VCCDs) are provided between the respective vertically arranged neighboring photodiodes to transmit electric charges, generated by the respective photodiodes, in a vertical direction, and a plurality of horizontal charge coupled devices (HCCDs) are provided to transmit the electric charges, transmitted by the respective vertical charge coupled devices, in a horizontal direction. Also, a sense amplifier is provided to sense the horizontally transmitted electric charges to output electric signals.

Disadvantages of the CCD include a complicated driving method, high electric power consumption, and a complicated manufacturing process requiring a multi-step photo process. Furthermore, the CCD has another disadvantage in that it is difficult to integrate a control circuit, a signal processing circuit, an analogue/digital conversion circuit (A/D converter), etc. in a CCD chip. This makes it impossible to achieve compact-sized products.

Recently, the CMOS image sensor has received much recognition as a next-generation image sensor to solve the problems of the CCD. The CMOS image sensor is a device employing a CMOS technology. The CMOS image sensor uses a control circuit, a signal processing circuit, etc. as peripheral circuits, such that MOS transistors, having the same number as unit pixels, are formed on a semiconductor substrate. The outputs of the respective unit pixels are sequentially detected by the MOS transistors by a switching method. Meaning, the CMOS image sensor is characterized in that a photodiode and a MOS transistor are formed in a unit pixel to sequentially detect electric signals of the respective unit pixels by a switching method, thereby achieving an image.

As a result of employing a CMOS fabrication technology, the CMOS image sensor has several advantages, for example, low electric power consumption, and a simplified fabricating process based on a reduced number of photo process steps.

Figure 1A:
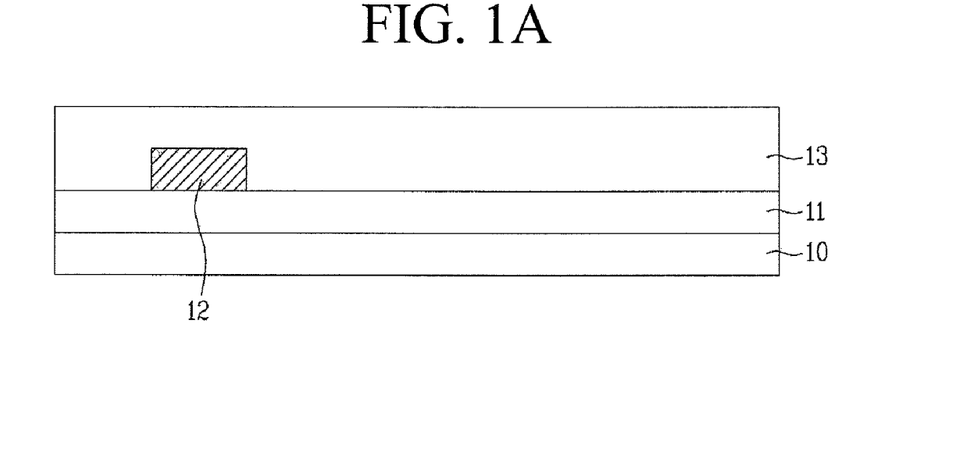
FIGS. 1A to 1C illustrate a method for fabricating a CMOS image sensor.
Figure 1B:
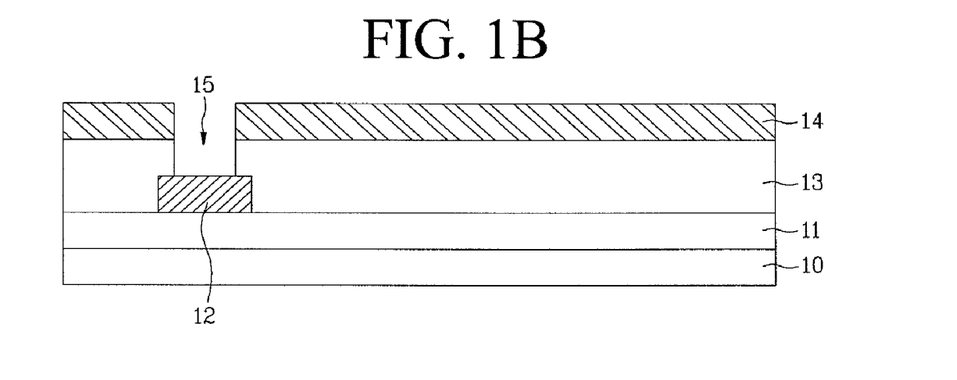
Figure 1C:
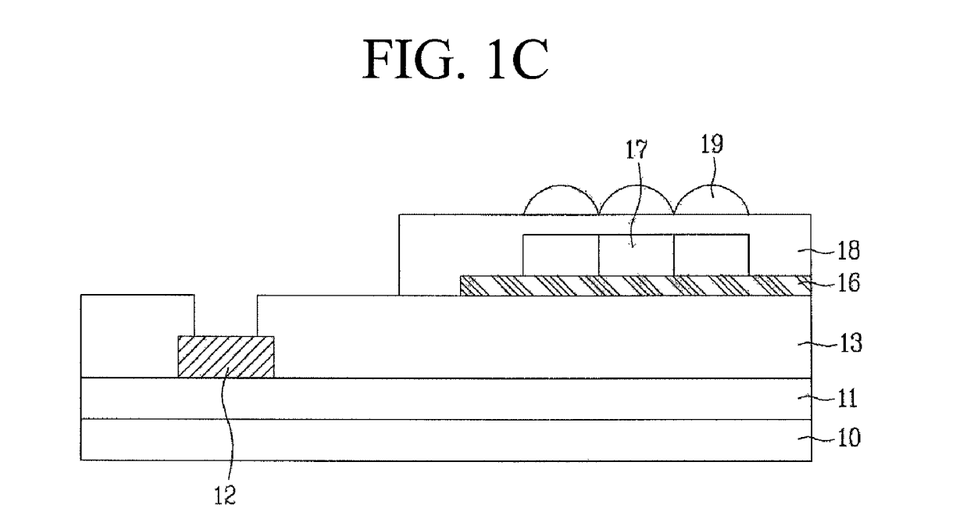

Example FIGS. 1A to 1C illustrate a method for fabricating a CMOS image sensor and which may include dielectric film 11, such as a gate dielectric film or an interlayer dielectric film, formed on and/or over semiconductor substrate 10. Metal pad 12 for each signal line is formed on and/or over dielectric film 11. Passivation film 13, made of an oxide film or a nitride film, is formed on and/or over the entire surface of dielectric film 11, including metal pad 12.

As illustrated in example FIG. 1B, photosensitive film 14 is applied to the top of passivation film 13 and patterned by an exposure and development process to expose the top of metal pad 12. Passivation film 13 is selectively etched using the patterned photosensitive film 14 as a mask to form opening 15 at the exposed metal pad 12.

As illustrated in example FIG. 1C, a silicon nitride film or a silicon oxide nitride film is deposited on and/or over the entire surface of semiconductor substrate 10 to form planarization layer 16. Planarization layer 16 is selectively etched by a photo and etching process such that planarization layer 16 is left only at the remaining area excluding the metal pad. Color filter layers 17 are formed on and/or over planarization layer 16 corresponding to respective photodiode regions. The respective color filter layers are formed by applying respective color resists and performing a photolithography using an additional mask. Subsequently, overcoat layer 18 is formed on and/or over the entire surface of semiconductor substrate 10, including color filter layers 17. The remaining area, excluding metal pad 12, is selectively etched by a photo and etching process. A polymer material is then applied to the top of overcoat layer 18 to form a micro lens material layer. Photosensitive film 14 is patterned by an exposure and development process to define a micro lens region. Subsequently, the micro lens material layer is selectively patterned using photosensitive film 14 to form a micro lens pattern corresponding to color filter layers 17. The micro lens pattern is heat-treated by a reflow process to form hemispherical micro lenses 19 having a predetermined radius of curvature.

In the afore-described method for fabricating the CMOS image sensor, however, color filter layers 17 and planarization layer 16 form a sharp step between a scribe lane and a pixel region, before the formation of the micro lenses. Accordingly, the film thickness of the applied photo resist is non-uniform. The non-uniform thickness of the photo resist, in turn, causes non-uniformity in the thickness of micro lenses 19. For a spin coat type resist application, such non-uniformity of thickness causes striation in which radial stripes are formed outward from the center of a wafer. The striation causes defectiveness in which vivid stripes are diagonally formed on the CMOS image sensor.

Moreover, in the afore-described method for fabricating the CMOS image sensor, the metal pad is opened for connection with an external circuit, and then the process for forming the color filter layers and the micro lenses are carried out. All the processes are photolithography processes using a strong base developing solution, which may result in corrosion of the grounded metal pad.

SUMMARY

Embodiments relate to a complementary metal oxide silicon (CMOS) image sensor, and more particularly, to a method for fabricating a CMOS image sensor that can prevent corrosion of a metal pad.

Embodiments relate to a method for fabricating a CMOS image sensor that can include at least one of the following steps: sequentially forming a dielectric film, a metal pad having an opening, and a first passivation film on and/or over a semiconductor substrate having a scribe lane and a pixel region defined therein; and then forming a color filter layer on and/or over the first passivation film at the pixel region; and then forming an overcoat layer on and/or over the entire surface of the semiconductor substrate including the metal pad, to reduce the step difference between the scribe lane and the pixel region; and then forming a micro lens on and/or over the overcoat layer at the pixel region; and then forming a photo resist to expose the overcoat layer at the scribe lane; and then performing an etching process on the entire surface of the semiconductor substrate to etch the overcoat layer at the scribe lane; and then removing the photo resist by a cleaning process.

Embodiments relate to a method for fabricating a CMOS image sensor that can include at least one of the following steps: sequentially forming a dielectric film, a metal pad having an opening, and a first passivation film on and/or over a semiconductor substrate having a scribe lane and a pixel region defined therein; and the forming a color filter layer on and/or over the first passivation film at the pixel region; and then forming an overcoat layer on and/or over the entire surface of the semiconductor substrate including the metal pad; and then removing the overcoat layer at the scribe lane by exposure and development; and then filling the region where the overcoat layer is etched with a photo resist pattern to reduce the step difference between the scribe lane and the pixel region; and then forming a micro lens on and/or over the overcoat layer at the pixel region; and then removing the photo resist pattern by a cleaning process.

DRAWINGS

Example

Example

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 2A:
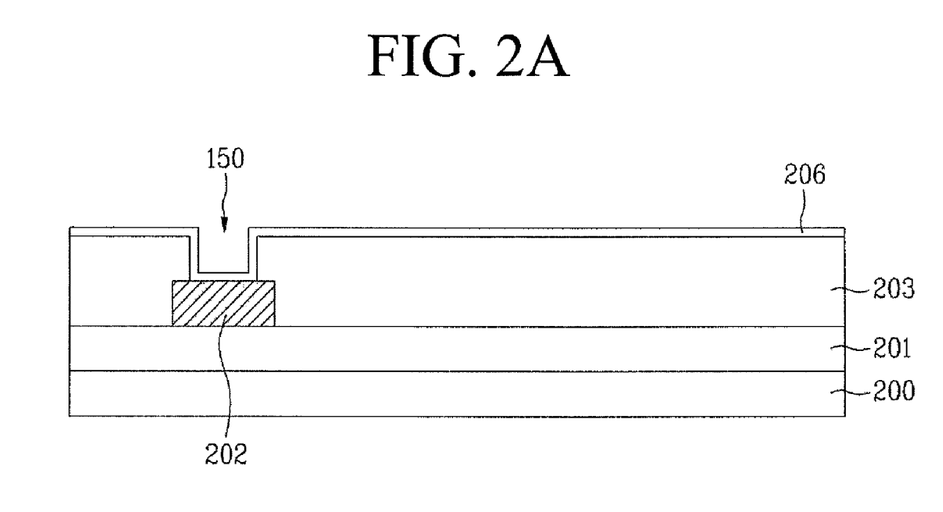
FIGS. 2 to 5 illustrate a method for fabricating a CMOS image sensor, in accordance with embodiments.

As illustrated in example FIG. 2A, a CMOS image sensor manufactured in accordance with embodiments can include dielectric film 201, such as a gate dielectric film or an interlayer dielectric film formed on and/or over semiconductor substrate 200. Metal pad 202 for each signal line is formed on and/or over dielectric film 201. First passivation film 203, made of at least one of an oxide film and a nitride film, is formed on and/or over the entire surface of dielectric film 201 including metal pad 202. Subsequently, a photosensitive film is applied to the top of first passivation film 203 and patterned by an exposure and development process to the top surface of metal pad 202. First passivation film 203 is selectively etched using the patterned photosensitive film as a mask to form opening 150 exposing the top surface of metal pad 202. A thermosetting resin is applied to the entire surface of semiconductor substrate 200 including opening 150, and is then hardened to form second passivation film 206 for protecting metal pad 202 during the following processes. Second passivation film 206 preferably has a thickness of 0.05 to 0.1 um.

Figure 2B:
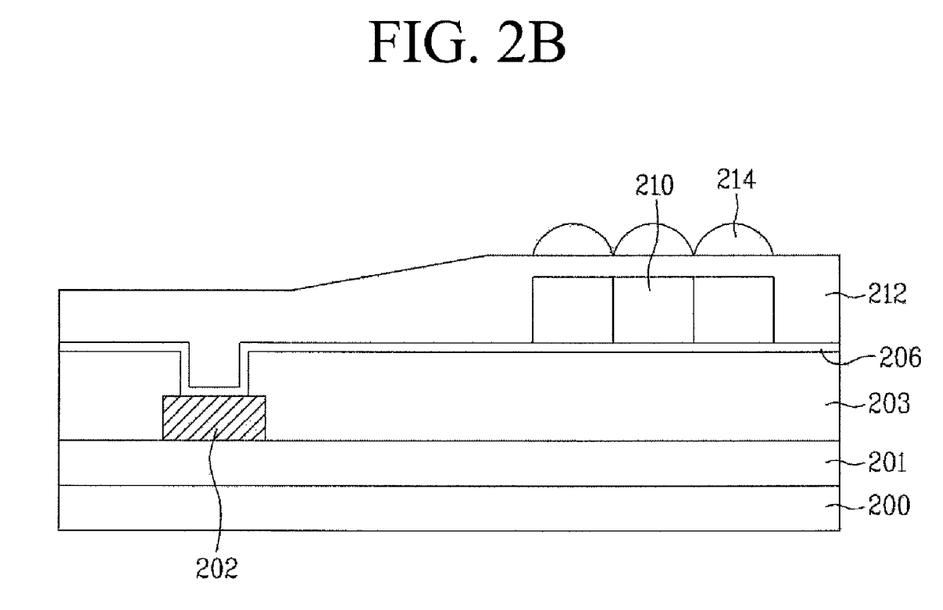

As illustrated in example FIG. 2B, color filter layers 210 are formed corresponding to respective photodiode regions. Color filter layers 210 are formed by applying respective color resists and performing a photolithography using an additional mask. A planar type overcoat layer 212 is formed on and/or over the entire surface of semiconductor substrate 200 including color filter layers 210. Overcoat layer 212 is not yet selectively developed to open a scribe lane but is hardened to form a gentle step between a pixel region and the scribe lane, and thus, minimize the step difference between the scribe lane and the pixel region. A photosensitive film is applied to the top of overcoat layer 212 at the pixel region to form a micro lens material layer. The photosensitive film for micro lenses is selectively developed by a lithography process to form a micro lens pattern corresponding to color filter layers 210. The micro lens pattern is heat-treated by a reflow process to form hemispherical micro lenses 214 having a predetermined radius of curvature. During the process for forming the micro lenses, a striation phenomenon does not occur since the step formed between the scribe lane and the pixel region is not sharp but gentle.

Figure 2C:
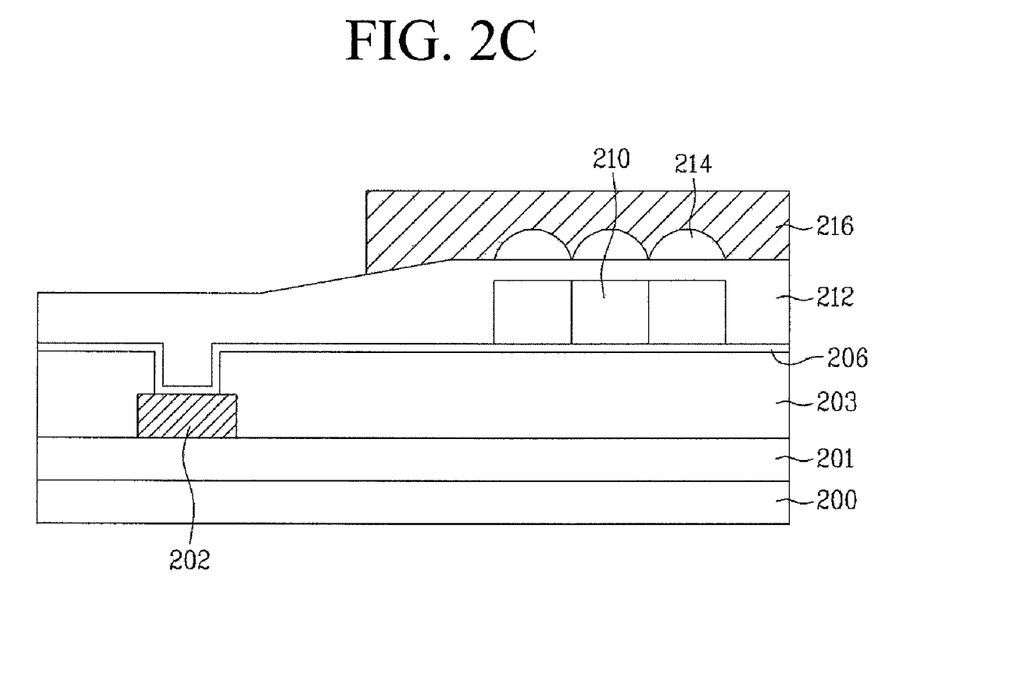

As illustrated in example FIG. 2C, photo resist 216 pattern is formed to expose overcoat layer 212 of the scribe lane.

Figure 2D:
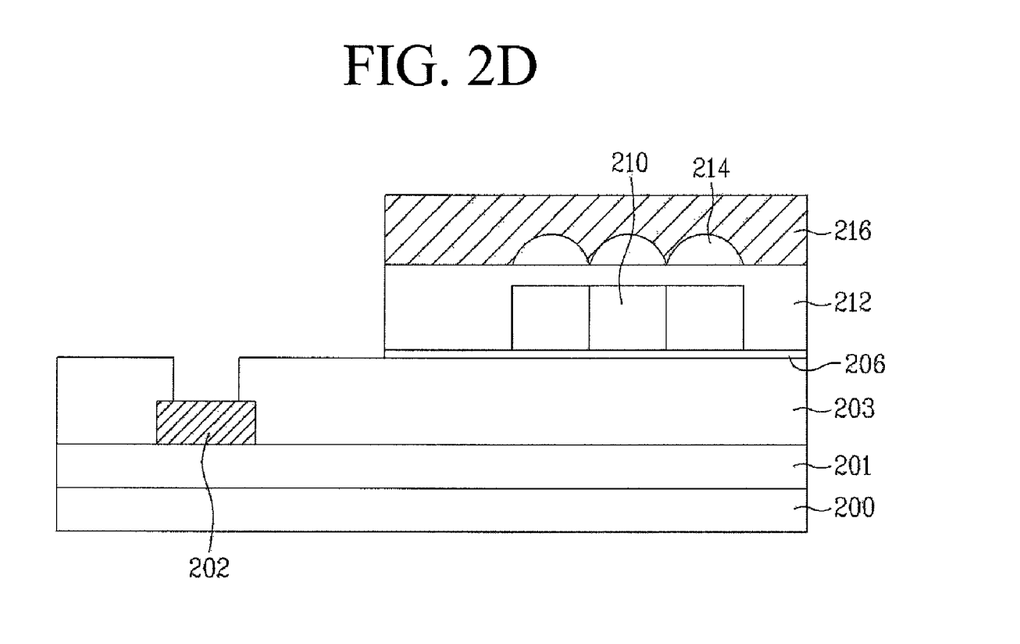

As illustrated in example FIG. 2D, an $O_2$ ashing process is carried out on the entire surface of semiconductor substrate 200. Photo resist 216 pattern and second passivation film 206 and overcoat layer 212, formed on and/or over the scribe lane, are removed to almost the same thickness because photo resist 216 pattern, second passivation film 206 and overcoat layer 212 have no selectivity.

Figure 2E:
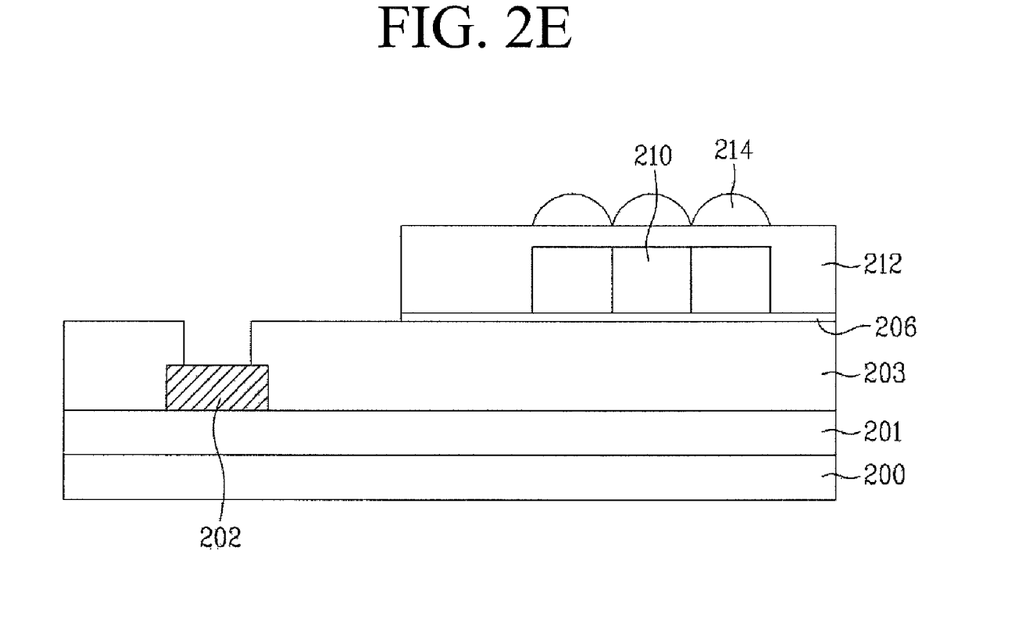

As illustrated in example FIG. 2E, photo resist 216, formed on and/or over the uppermost top of semiconductor substrate 200, is removed with thinner. This results in color filter layers 210, overcoat layer 212, and micro lenses 214 remaining on semiconductor substrate 200 to complete a CMOS image sensor. Second passivation film 206, overcoat layer 212 and micro lenses 214, which are thermosetting or negative resists, after being subjected to heat-treatment, have already been hardened to exhibit very high chemical resistance. On the other hand, photo resist 216 is a positive resist, and thus, is easily soluble in a solvent. After the $O_2$ ashing, therefore, it is possible to remove photo resist 216 using thinner, for example a solvent of PGMEA, without damage to second passivation film 206, overcoat layer 212 and micro lenses 214.

Consequently, the method for fabricating the CMOS image sensor in accordance with embodiments can minimize the step difference between the scribe lane and the pixel region to protect the metal pad, thereby preventing the occurrence of striation and the corrosion of the metal pad.

Example FIGS. 3A to 3D illustrate a method for fabricating a CMOS image sensor in accordance with embodiments. Components of the embodiment are identical to those illustrated in example FIGS. 2A to 2E are denoted by the same reference numerals, and a duplicated description thereof will not be given.

Figure 3A:
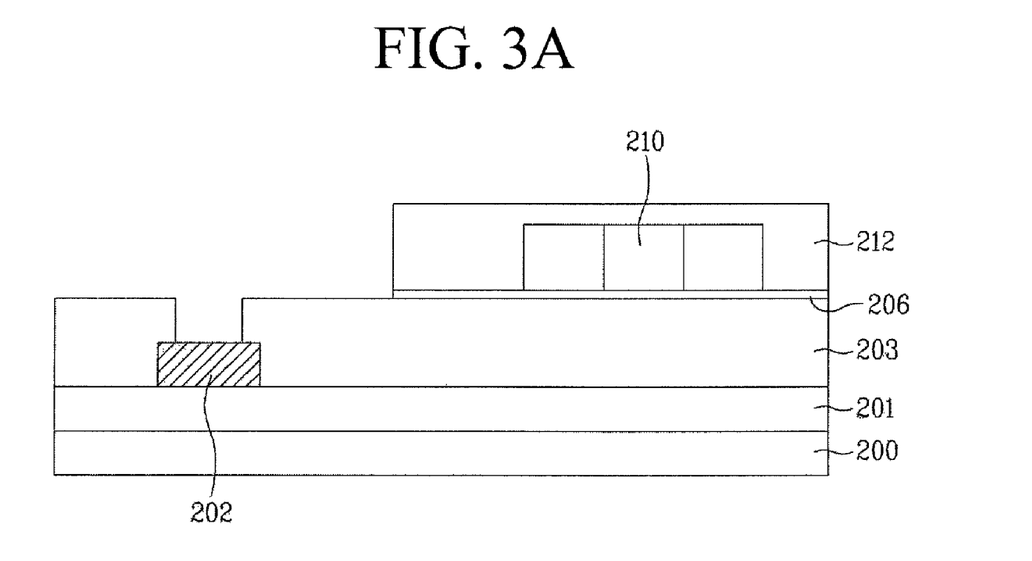

As illustrated in example FIG. 3A, an overcoat layer 212 is formed on and/or over the entire surface of semiconductor substrate 200 including color filter layers 210 and selectively developed by a photo process such that overcoat layer 212 is left only at the remaining area excluding metal pad 202.

Figure 3B:
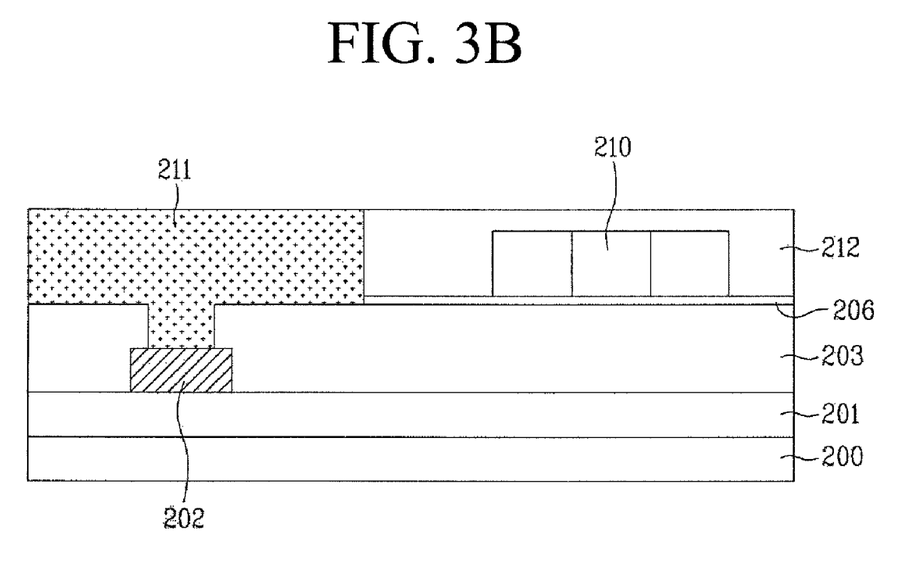

As illustrated in example FIG. 3B, a scribe lane region is filled by a photo process with positive photo resist pattern 211 of the same thickness as overcoat layer 210. The step difference between the scribe lane and a pixel region is minimized by positive photo resist pattern 211.

Figure 3C:
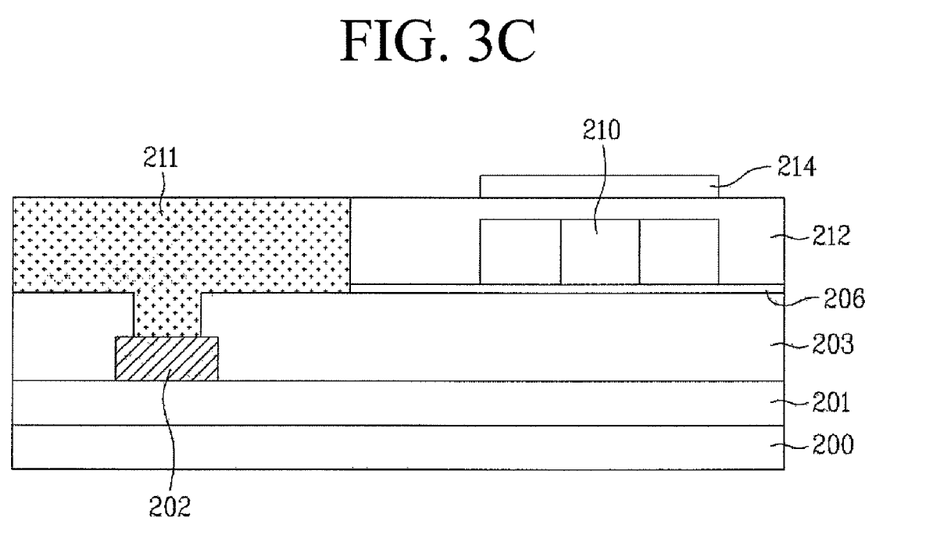

As illustrated in example FIG. 3C, a photosensitive film is applied to the top surface of overcoat layer 212 to form a micro lens material layer. A photo process is carried out on the photosensitive film to form a micro lens pattern corresponding to color filter layers 210. The micro lens pattern is heat-treated by a reflow process to form hemispherical micro lenses 214 having a predetermined radius of curvature. During the process for forming the micro lenses, a striation phenomenon does not occur since the step formed between the scribe lane and the pixel region is not sharp but gentle.

Figure 3D:
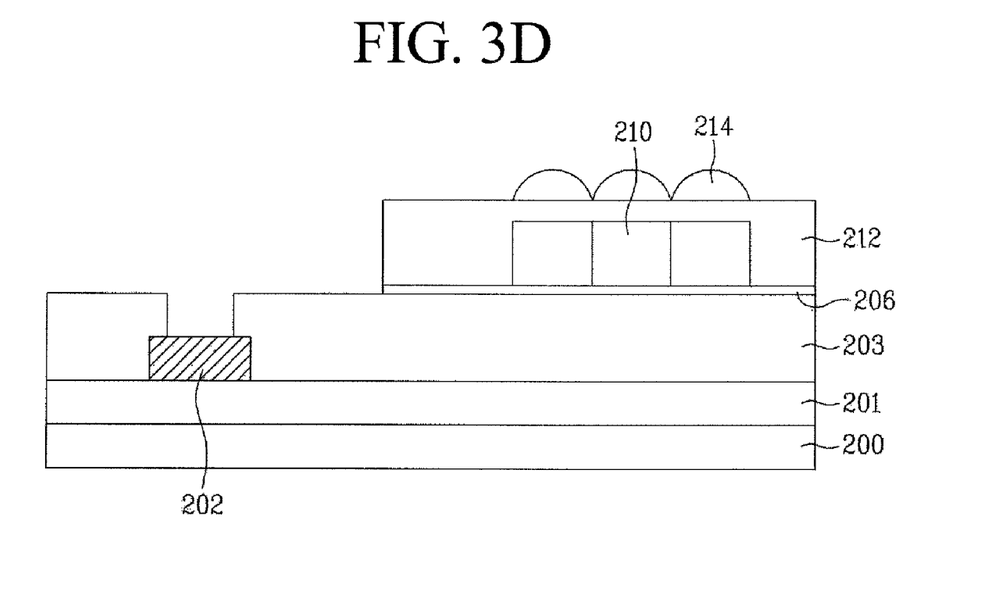

As illustrated in example FIG. 3D, positive photo resist pattern 211 on the scribe lane region is removed with a thinner, for example, a solvent of propylene glycol mono ether acetate (PGMEA), to complete a CMOS image sensor. Micro lenses 214, which are thermosetting or negative resists, after heat-treated have already been hardened to exhibit very high chemical resistance. This results in protection of micro lenses 214 from the thinner, whereas photo resist 216 being a positive resist is easily removed by the thinner.

Consequently, the method for fabricating the CMOS image sensor in accordance with embodiments can minimize the step difference between the scribe lane and the pixel region to protect the metal pad, thereby preventing the occurrence of striation and the corrosion of the metal pad.

Example FIGS. 4A to 4D illustrate a method for fabricating a CMOS image sensor, in accordance with embodiments. Components of the third embodiment identical to those of illustrated in the previous examples are denoted by the same reference numerals, and a duplicated description thereof will not be given.

Figure 4A:
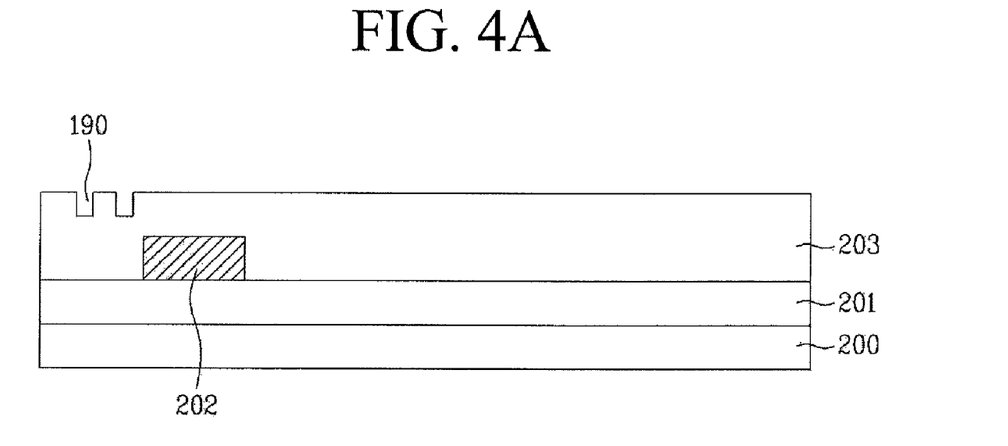

As illustrated in example FIG. 4A, dielectric film 201, such as a gate dielectric film or an interlayer dielectric film, is formed on and/or over semiconductor substrate 200. Metal pad 202 for each signal line is formed on and/or over dielectric film 201. First passivation film 203, made of an oxide film or a nitride film, is formed on and/or over the entire surface of dielectric film 201 including metal pad 202. Align key pattern 190 for color filter alignment is formed on and/or over first passivation film 203.

Figure 4B:
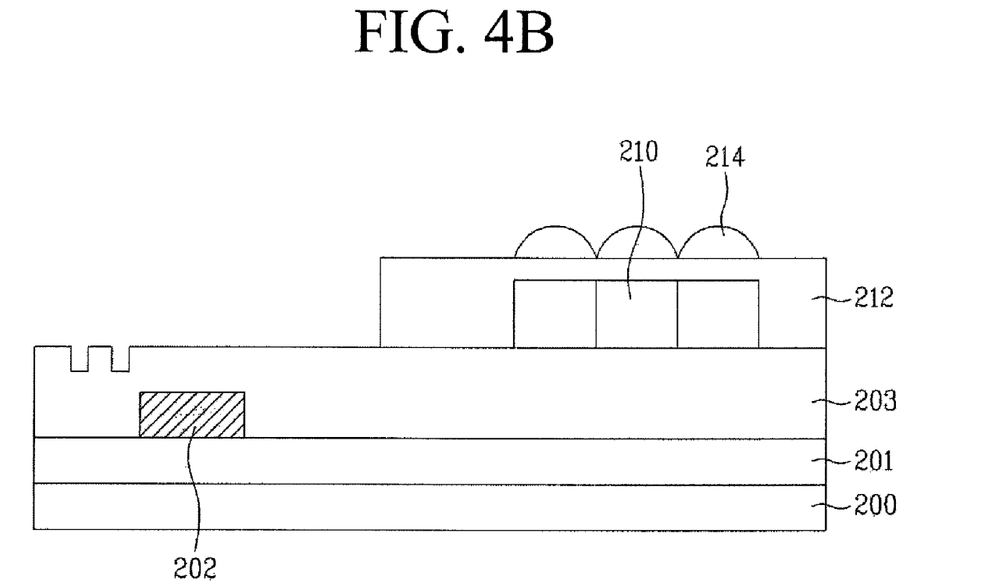

As illustrated in example FIG. 4B, color filter layers 210 are formed corresponding to respective photodiode regions. Color filter layers 210 are formed by applying respective color resists and performing a photolithography using an additional mask. Overcoat layer 212 is formed on and/or over the entire surface of semiconductor substrate 200 including color filter layers 210. Overcoat layer 212 is not selectively developed by a photo process such that overcoat layer 212 is left only at the remaining area excluding the metal pad. A photosensitive film is applied to the top surface of overcoat layer 212 at the pixel region to form a micro lens material layer. The micro lens material layer is developed to form a micro lens pattern corresponding to color filter layers 210. The micro lens pattern is heat-treated by a reflow process to form hemispherical micro lenses 214 having a predetermined radius of curvature.

Figure 4C:
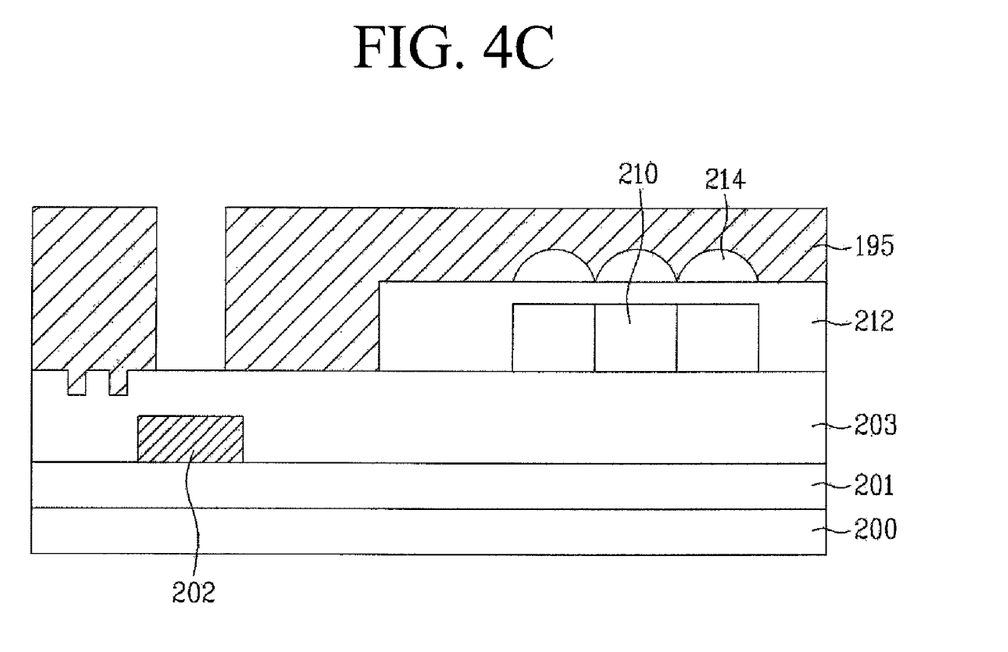

As illustrated in example FIG. 4C, pad open photo resist pattern 195 is formed to expose a metal pad opening region. First passivation film 203 is selectively etched by a reactive ion etching (RIE) process using pad open photo resist pattern 195 as a mask to form opening 150 exposing the metal pad 202.

Figure 4D:
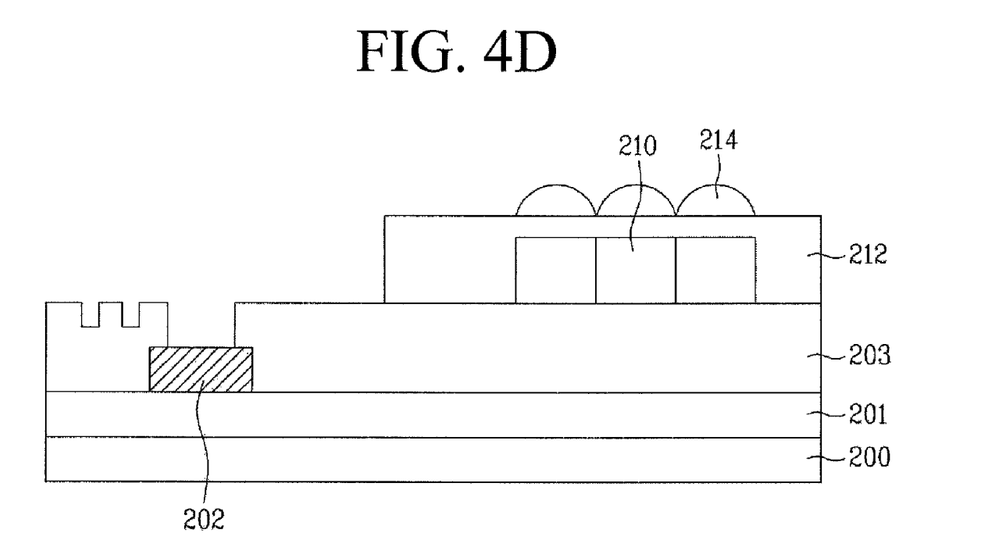

As illustrated in example FIG. 4D, only pad open photo resist pattern 195 is selectively removed. Pad open photo resist pattern 195 has changed into a hard polymer state by the RIE process. However, the side of pad open photo resist pattern 195 is maintained in a relatively soft state as compared to the top of pad open photo resist pattern 195, which has been hardened by the RIE process. Consequently, the top polymer is easily removed by swelling generated at the side of pad open photo resist pattern 195 when thinner, for example PGMEA, is used to remove pad open photo resist pattern 195. However, the top polymer is not solved in the thinner. For this reason, an $O_2$ ashing process is carried out to remove the top polymer, and then pad open photo resist pattern 195 is fully removed with the thinner.

Consequently, the method for fabricating the CMOS image sensor in accordance with embodiments can prevent some of the polymer, which is not soluble in the thinner, from being left on the micro lens pattern and the metal pad, and thus, also from being left at the pixel region, after a final process. This can prevent the deterioration in image characteristics of the sensor.

Example FIGS. 5A to 5D illustrate a method for fabricating a CMOS image sensor, in accordance with embodiments.

Figure 5A:
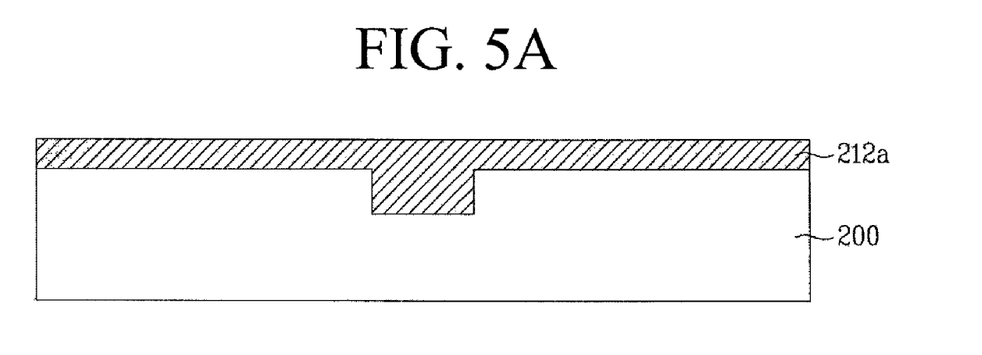

As illustrated in example FIG. 5A, first overcoat layer 212a, which is a planar type negative photo resist, is formed on the entire surface of semiconductor substrate 200 for a CMOS image sensor constructed in an above interconnect structure. The photo resist is thinly applied to a pixel region, and a groove formed in a scribe lane is filled with the photo resist, since the photo resist is the planar type negative photo resist. An exposure process using a photo mask to cover the pixel region is carried out to harden only first overcoat layer 212a of the scribe lane. The reason to use the planar type photo resist is because a conformal type photo resist uniformly covers the scribe lane and the pixel region, when the step difference exceeds 1 um, with the result that the step difference at the scribe lane region becomes larger.

Figure 5B:
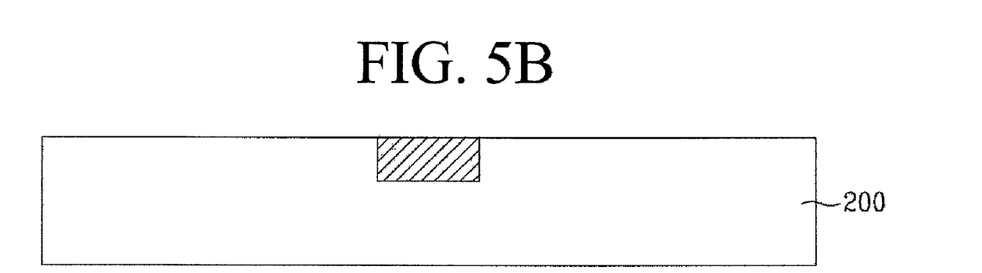

As illustrated in example FIG. 5B, first overcoat layer 212a is removed by a developing process such that only the scribe lane region is filled with first overcoat layer 212a, thereby removing the step difference between the pixel region and the scribe lane region.

Figure 5C:
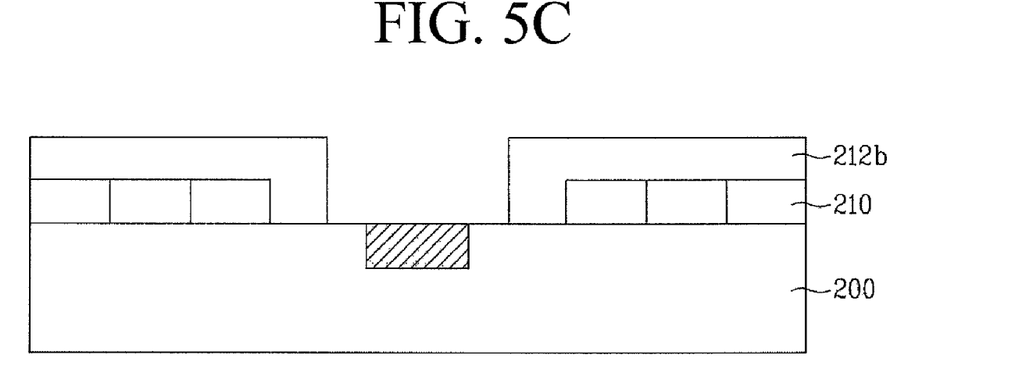

As illustrated in example FIG. 5C, color filter layers 210 are formed on and/or over semiconductor substrate 200 at the pixel region. Second overcoat layer 212b is formed on and/or over the entire surface of semiconductor substrate 200 including color filter layers 210 and excluding the region where first overcoat layer 212a is formed. A photo mask having a tone opposite to that of a mask for exposing only the scribe lane to remove the step difference at the scribe lane region with first overcoat layer 212a is used to expose only the pixel region. Second overcoat layer 212b is formed with a thickness corresponding to approximately the step difference at the scribe lane in consideration that second overcoat layer 212b is ashed during the following $O_2$ ashing process.

Figure 5D:
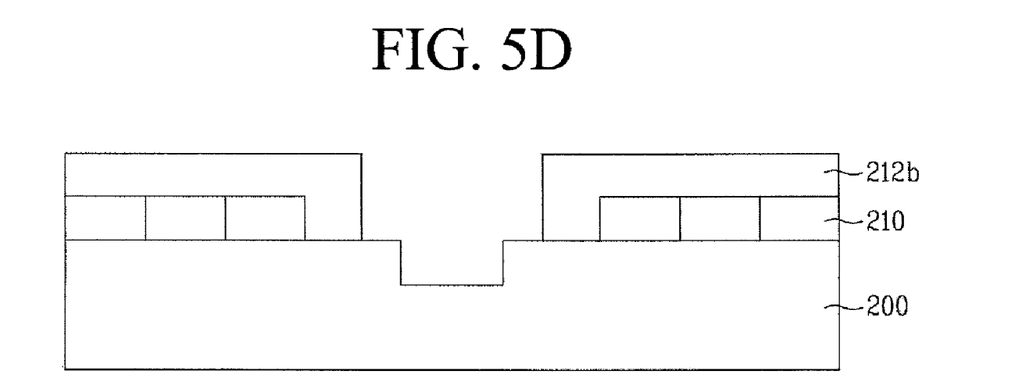

As illustrated in example FIG. 5D, first overcoat layer 212a at the scribe lane is removed by an $O_2$ ashing process.

Consequently, the method for fabricating the CMOS image sensor in accordance with embodiments can form color filter layers without striation due to coating defectiveness, in the CMOS image sensor constructed in the above interconnect structure.

As apparent from the above description, the method for fabricating the CMOS image sensor in accordance with embodiments has the effect of minimizing the step difference between the scribe lane and the pixel region to protect the metal pad, thereby preventing the occurrence of striation and the corrosion of the metal pad.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a CMOS image sensor comprising:

sequentially forming a dielectric film, a metal pad having an exposed upper surface, and a first passivation film on a semiconductor substrate having a scribe lane and a pixel region defined therein, wherein the first passivation film includes an opening which exposes the metal pad; and then forming and hardening a thermosetting resin on the entire surface of the semiconductor substrate including the metal pad and the first passivation film to form a second passivation film; and then forming a color filter layer on the first passivation film at the pixel region; and then reducing the step difference between the scribe lane and the pixel region by forming an overcoat layer on the entire surface of the semiconductor substrate including the metal pad, wherein the overcoat layer fills the opening; and then forming a micro lens on the overcoat layer at the pixel region; and then forming a photo resist to expose the overcoat layer at the scribe lane; and then performing an etching process on the entire surface of the semiconductor substrate to etch the overcoat layer at the scribe lane; and then removing the photo resist.

2. The method of claim 1, wherein forming the color filter layer comprises forming the color filter layer on the second passivation film at the pixel region.

3. The method of claim 2, wherein performing the etching process on the entire surface of the semiconductor substrate comprises etching the photo resist, the second passivation film and the overcoat layer to the same thickness.

4. The method of claim 1, wherein forming the overcoat layer comprises forming the overcoat layer in a planar type structure.

5. The method of claim 1, wherein etching the overcoat layer is done by performing an $O_2$ ashing process.

6. The method of claim 1, wherein performing the etching process on the entire surface of the semiconductor substrate comprises etching the photo resist and the first passivation film to the same thickness as the overcoat layer.

7. The method of claim 1, wherein the color filter is in direct contact with the second passivation film.

8. The method of claim 1, wherein the second passivation film is formed on an inner wall of the opening and the overcoat layer fills the opening over the second passivation film.

9. The method of claim 1, wherein the second passivation film is thinner than the first passivation film.

10. The method of claim 1, wherein the second passivation film has a thickness approximately of 0.05 to 0.1 μm.

11. The method of claim 1, wherein the first passivation film has an average thickness greater than a thickness of the metal pad.

12. The method of claim 1, wherein the first passivation film has a planar upper surface.

* * * * *